United States Patent
Chou

(10) Patent No.: US 11,604,530 B1
(45) Date of Patent: Mar. 14, 2023

(54) DISPLAY WITH TOUCH SENSING INTEGRATION

(71) Applicant: Decentralized Biotechnology Intelligence Co., Ltd., Taipei (TW)

(72) Inventor: Yao-Sheng Chou, Taipei (TW)

(73) Assignee: Decentralized Biotechnology Intelligence Co., Ltd., Taipei (TW)

( * ) Notice: Subject to any disclaimer, the term of this patent is extended or adjusted under 35 U.S.C. 154(b) by 0 days.

(21) Appl. No.: 17/842,776

(22) Filed: Jun. 16, 2022

(30) Foreign Application Priority Data

Jun. 23, 2021 (TW) ................................ 110122983

(51) Int. Cl.
    *G06F 3/041* (2006.01)
    *G06F 3/044* (2006.01)
    *H01L 27/32* (2006.01)

(52) U.S. Cl.
    CPC .......... *G06F 3/0412* (2013.01); *G06F 3/0445* (2019.05); *G06F 3/0446* (2019.05); *G06F 3/04166* (2019.05); *H01L 27/323* (2013.01)

(58) Field of Classification Search
    CPC .... G06F 3/0412; G06F 3/0445; G06F 3/0446; G06F 3/041–047; G06F 2203/041–04114; H01L 27/323
    See application file for complete search history.

(56) References Cited

U.S. PATENT DOCUMENTS

| 2014/0062907 | A1* | 3/2014 | Kim ...................... | G02F 1/1368 |
| | | | | 345/173 |
| 2015/0227233 | A1* | 8/2015 | Yi .......................... | G06F 3/0446 |
| | | | | 345/174 |
| 2015/0253890 | A1* | 9/2015 | Sobel .................... | G06F 3/0446 |
| | | | | 345/173 |
| 2016/0231098 | A1* | 8/2016 | Otaka ..................... | G01B 7/22 |
| 2017/0308212 | A1* | 10/2017 | Jin ........................ | G06F 3/0416 |
| 2019/0129534 | A1* | 5/2019 | Chiang ................ | G06F 3/0445 |

* cited by examiner

*Primary Examiner* — Sanjiv D. Patel
(74) *Attorney, Agent, or Firm* — Chih Feng Yeh; Huntington IP Consulting Co., Ltd.

(57) ABSTRACT

The present invention provides a novel pixel array with touch component integration, the structure includes pluralities of the pixels, arranged in an array with a gap between the horizontal space. Two touch electrode layers are arranged in the gap which are alternately with the pixels, thereby the spatial integration efficiency could be improved by integrating touch sensing electrode layers within the display pixels.

13 Claims, 6 Drawing Sheets

DISPLAY WITH TOUCH SENSING INTEGRATION

CROSS-REFERENCE STATEMENT

The present application is based on, and claims priority from, Taiwan Patent Application Serial Number 110122983, filed Jun. 23, 2021, the disclosure of which is hereby incorporated by reference herein in its entirety.

TECHNICAL FIELD

The present invention relates to technical field of display device, and more particularly, a display with touch sensing integration.

BACKGROUND

The display is one of the important components of electronic devices for providing user information, or for providing user to interact with the electronic devices by performing touch operations. The display panel technology is continuously evolving, from the earlier thin film transistor liquid crystal display (TFT-LCD), latterly developed organic light-emitting diode (OLED) to recently developed Micro-LED or Mini-LED display. Compared to traditional TFT-LCD, Micro-LED or Mini-LED has self-luminescence characteristics and can eliminate the backlight module of LED or cold cathode fluorescent lamp, which cause device's power consumption is reduced, device's thickness is thinner, and display's color is bright and display's dynamic contrast ratio is higher, so Micro-LED or Mini-LED display has become the mainstream technology of display development in the future.

Generally speaking, the existing control methods for touch display are mainly divided into two types, i.e. capacitive type control and resistive type control. In the case of capacitive type touch control, when user's finger touches the display, because human skin will conduct electricity, the transparent electrodes of the display (usually Indium Tin Oxide, ITO) will generate a contact capacitance due to the finger touch. Such contact capacitance will have value that is different from the capacitance value while the display is not touched, a small electrical charge is drawn to the point of contact, which effectively becomes a functioning capacitor. The resulting change in the electrostatic field is then measured to pinpoint where the contact took place. In the existing capacitive touch screen, no matter whether the display adopts a single-sided conductive structure or a double-sided conductive structure, when the connection between each basic pixel unit is cascaded or non-cascaded, one of the traditional wiring methods is a bridging wiring structure to achieve the purpose of improving spatial utilization efficiency in a compact space. Taking Chinese patent publication no. CN202351834U as an example, it disclosed a touch panel with conductive bridge structure, where the conductive bridge structure is coated with an insulating layer to connect between the sensing pads of the display.

Please refer to FIG. 1, the existing structure includes a touch driving circuit 11 and a display driving circuit 13, both of them are designed to operate independently. Currently, in the market, some manufacturers have proposed a framework to have the touch driving circuit 11 and the display driving circuit 13 in the display been integrated to the circuits inside the display screen 20, where both the underlying display module 21 and the touch module 23 are integrated into one chip, the above-mentioned technical solution is called touch with display driver integration (TDDI) chip 10. For example, Taiwan patent publish no. TW 202004462A disclosed an integrated driving device can alternately operate in a display phase and a touch phase in a continuous sequence to achieve the purpose of simplifying the internal structure of a touch display panel. The proposed simple structure of TDDI can save the cost of films and adhesives. Compared with the traditional discrete solution (Discrete Touch), it is more advantageous in manufacturing cost. On the other hand, for manufacturers, the structure of TDDI is also helpful for circuit design. It simplifies and shortens the device's development time.

In addition to the current market requirements for larger touch display sizes, applicant believes that the framework of the TDDI integrated chip in the existing display technology can improve the space configuration of the internal components of the display, but in the existing technology, the integration scheme for both the display and the touch panel has yet been discussed.

SUMMARY OF THE INVENTION

In view of this, in order to solve the above problems, the present invention proposes a display with touch sensing integration, which includes a touch display module comprising a plurality of pixels arranged transversally and longitudinally on the same plane to form a light-emitting array, a plurality of gaps existing between adjacent pixels, a two-layered touch electrode layer structure with a transversal (upper) touch electrode layer and a longitudinal (lower) touch electrode layer which are formed in the form of upper and lower layers been arranged in between the gaps, enabling that the two-layered touch electrode layer can be arranged in between the adjacent pixels, where the transversal (upper) touch electrode layer and the longitudinal (lower) touch electrode layer are respectively two transparent touch electrodes been arranged in different directions. In an embodiment of the present invention, at least one touch electrode layer and the plurality of pixels are located on the same plane. In addition, when viewed from a three-dimensional perspective, the positions of the plurality of pixels and the transparent touch electrodes are staggered, enabling the spatial utilization efficiency of the display with touch sensing integration to increase.

According to the present disclosure, a display with touch sensing integration includes conductive wires coupled to a touch control display module for transmitting driving signals and power. The driving module is coupled to the conductive wires, and transmits the driving signals into the touch display module. In order to prevent the driving signals between the conductive wires from interfering with each other during the transmission of the driving signals, driving sequences for driving the touch function and for driving the display function can be operated by different frequencies. Wherein, the light-emitting layer of each touch display module includes a pixel array capable of emitting three primary colors of RGB to display a desired image, and a plurality of touch display electrodes can be arranged transversally and longitudinally to form the integrated touch element of display device. In the present invention, since the pixel array and the touch electrode layer can be spatially integrated, it can be complemented between the traditional bridge wiring structure and the TDDI integrated chip structure to further reduce the thickness of the display, and make the display with touch sensing integration having the flexibility to adjust during etching process or mass transfer, so as to improve the yield and reduce the cost.

According to the present disclosure, the plurality of gaps can be described by a coordinate system including the transversal gaps w in transversal direction, the longitudinal gaps t in longitudinal direction, and the vertical gap h in vertical direction. The definition of transversal direction is the longer side of the display with touch sensing integration, and its direction is x direction; the definition of longitudinal direction is the shorter side of the display with touch sensing integration, and its direction is y direction; the vertical direction is defined as the height direction of the display with touch sensing integration, and its direction is z direction.

According to the present disclosure, the touch display utilizes a sub-millimeter light-emitting diode (Mini LED), a micrometer light-emitting diode (Micro LED), or an organic light-emitting diode (OLED) as a light source. Since both Mini LED and Micro LED are capable of emitting light by themselves, they can be independently used as the display light source, and the structure of the LCD can be omitted. Similarly, when the touch display utilizes OLED as the display light source, it is self-illuminating based on the characteristics of OLED, so it does not need backlight light source for illumination, and it has the characteristics of fast response, light weight, thin thickness, simple structure, low cost, and high dynamic contrast.

According to the present disclosure, the touch display module has a multi-layer stack structure when it is viewed from cross-sectional viewing direction, the multi-layer stack structure includes a light-transmitting layer located on the top, a touch electrode layer located in the middle, and a substrate on the bottom. The touch electrode layer in the gap is divided into a transversal (upper) touch electrode layer and a longitudinal (lower) touch electrode layer, which are respectively provided with transparent touch electrodes interleaved in longitude and latitude directions (one is in the x direction, and the other is in the y direction), the touch electrodes at the upper and lower ends can form a capacitor structure of a parallel plate. When a touch pen or an user's hand approaches, the electric field and capacitance distribution between the upper and lower electrodes will change, the touch display module can be served as the user's input and operation interface by detecting these changes.

In one preferred embodiment, the plurality of pixels may be adjacent to one of the touch electrode layers, that is, the plurality of pixels and one of the touch electrode layers may be located on the same plane.

In one preferred embodiment, the plurality of pixels can also be located at the upper end or the lower end of the touch electrode layer, that is, the plurality of pixels and the touch electrode layer can be located on different levels.

In one preferred embodiment, the space between two touch electrode layers has a dielectric layer and is coupled to an external power module. When the touch pen or the user's hand approaches, the transparent touch points on the upper and lower ends can detect the change of capacitance.

In one preferred embodiment, the display with touch sensing integration, in addition to a set of touch electrode layers and a plurality of pixels being disposed between the transparent layer and the substrate in a sandwich structure, another set of touch electrode layers can be arranged such that one of them is disposed on top of the dielectric layer and the other is arranged above or below the substrate. That is, two sets of touch electrode layers of the display device integrating the touch components, thereby realizing the application of double-layer touch sensing. The scanning frequencies (Scan Rate) for operating them are different to avoid mutual interference.

In one preferred embodiment, scanning frequency utilize to operate the longitudinal touch electrodes and the transversal touch electrodes is different from that of operating the plurality of pixel units.

In one preferred embodiment, material of the transversal touch electrodes or the longitudinal touch electrodes is selected from Indium Tin Oxide (ITO), nanosilver, carbon nanotube (CNT), or Zinc Oxide (ZnO).

BRIEF DESCRIPTION OF THE DRAWINGS

The components, characteristics and advantages of the present invention may be understood by the detailed descriptions of the preferred embodiments outlined in the specification and the drawings attached.

DETAILED DESCRIPTION

Figure 1:
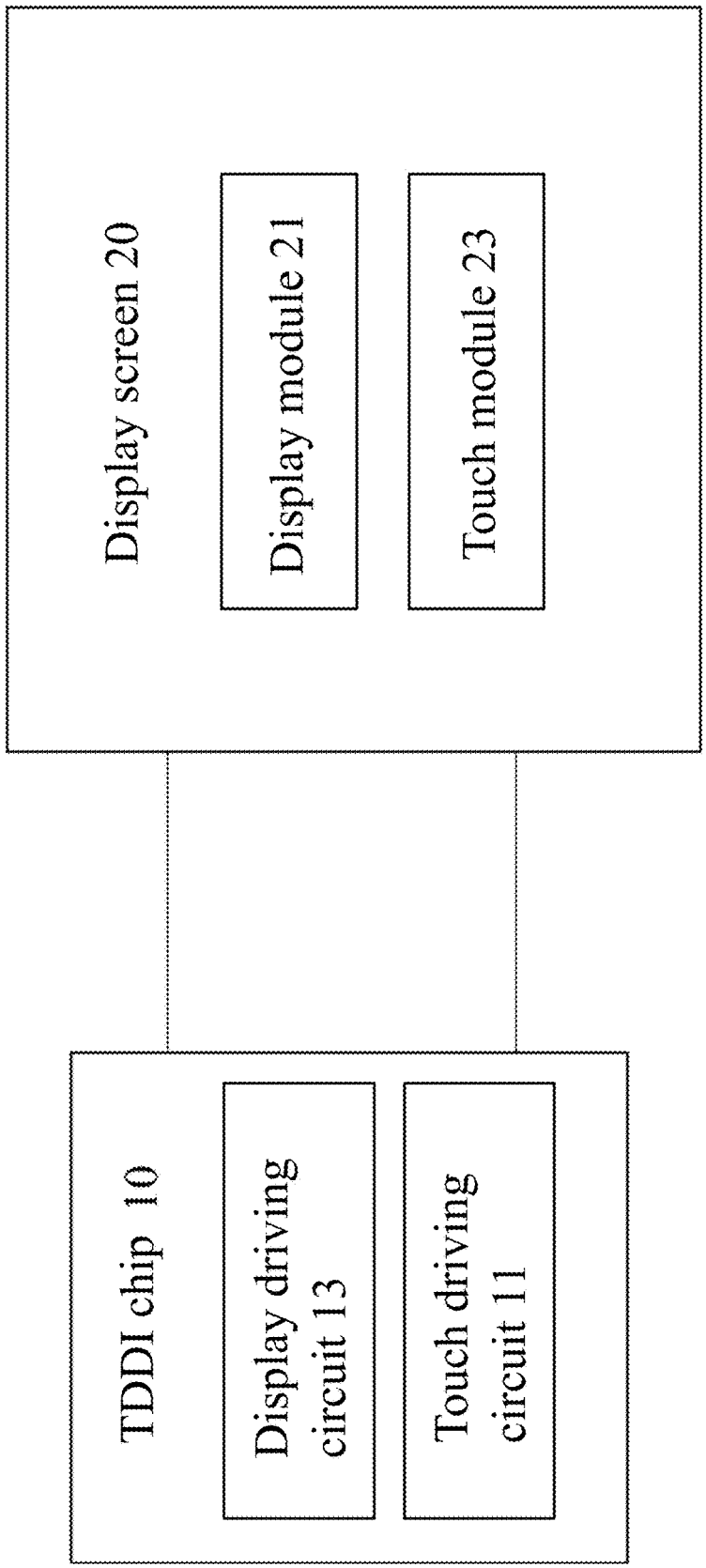
FIG. 1 illustrates a method of controlling the display module and the touch module in the display by a TDDI chip integrating the touch circuit and the display circuit in the prior art.

Some preferred embodiments of the present invention will now be described in greater detail. However, it should be recognized that the preferred embodiments of the present invention are provided for illustration rather than limiting the present invention. In addition, the present invention can be practiced in a wide range of other embodiments besides those explicitly described, and the scope of the present invention is not expressly limited except as specified in the accompanying claims.

The purpose of the present invention is to meet the current market demand of electronic devices with thin displays. The present invention proposes to arrange the touch electrodes in the gaps of the pixel units, so that the traditional transparent touch electrodes (usually indium tin oxide, Indium Tin Oxide, ITO) can be spatially integrated with the pixel units to optimize the structural configuration of the traditional touch display. When this display structure is applied to Micro-LED, Mini-LED or OLED display, which integrates the touch electrodes, and at the same time reduce the overall thickness of the display. The detailed technical means of integrating the pixels and the wirings will be described as follows.

In order to achieve the object of the present invention, please refer to FIGS. 2-5, a display 100 with touch sensing integration is proposed, the display 100 having a flat surface area on a substrate 207. To clearly describe the directions corresponding to the longitudinal direction, the transverse direction and the height, the directions may refer to the x-y-z coordinate system depicted in FIG. 2. In addition, there is an cross-sectional cutting along A-A' in FIG. 2, where the cross-sectional views depicted in FIG. 3A, FIG. 3B, and FIGS. 4-5 illustrate the detailed stacking structure of each embodiment accordingly. The structure of the display 100 with touch sensing integration of the present invention includes a plurality of pixels 100a. The plurality of pixels 100a are arranged in a transversal and longitudinal manner to form a pixel array, a plurality of gaps are existed between adjacent pixels of the pixel array. Conductive wires (not shown) are coupled between the pixels 100a for transmitting electrical signals. The aforementioned gaps can be categorized as transversal gaps w, longitudinal gaps 1, and vertical gap h, which corresponds to the gaps located in x-direction, y-direction, and z-direction shown in FIG. 2, respectively.

Based on the previous descriptions, in the embodiments of the present invention, Mini LED, Micro LED, or OLED can be used as the display. Each kind of these displays can be composed of various types of semiconductor materials with different energy gaps to excite photons of three wavelengths of RGB, so that they can be combined into self-luminous pixels 100a to display a desired picture. The touch electrode layer 205 includes a transversal (upper) touch electrode layer 205b and a longitudinal (lower) touch electrode layer 205a. In a pixel array formed by a plurality of pixels 100a, the touch electrodes ($X_1$-$X_M$; $Y_1$-$Y_N$) in the transversal (upper) touch electrode layer 205b and the longitudinal (lower) touch electrode layer 205a, assuming that the touch electrodes are composed of M transversal electrodes and N longitudinal electrodes, are arranged between adjacent pixels along the transversal or longitudinal direction to effectively utilize the space that is available, thereby integrating the touch electrodes ($X_1$-$X_M$; $Y_1$-$Y_N$) and pixels into the same layer, where the touch electrodes ($X_1$-$X_M$; $Y_1$-$Y_N$) are transparent. According to one aspect of the present invention, when the touch electrodes ($X_1$-$X_M$; $Y_1$-$Y_N$) and the plurality of pixels 100a can be better integrated into the same layer, the spatial utilization efficiency of the transversal gap w and the longitudinal gap/can be improved, where distance between the transversal gap w and the longitudinal gap/can be referred to pixel pitch. The display structure proposed by the present invention is different from the conventional structure in which two layers of electrodes are sequentially stacked on the display panel. Compared with the prior art, the display structure proposed by present invention has the advantages of having a compact, highly integrated structure and offering simplified manufacture process.

According to one embodiment of the present invention, the transparent touch electrodes, in addition to indium tin oxide (ITO), can also be selected from nanosilver, carbon nanotubes (CNT), zinc oxide (ZnO) or other materials having both good electrical conductivity and light transmittance at the same time.

Figure 2:
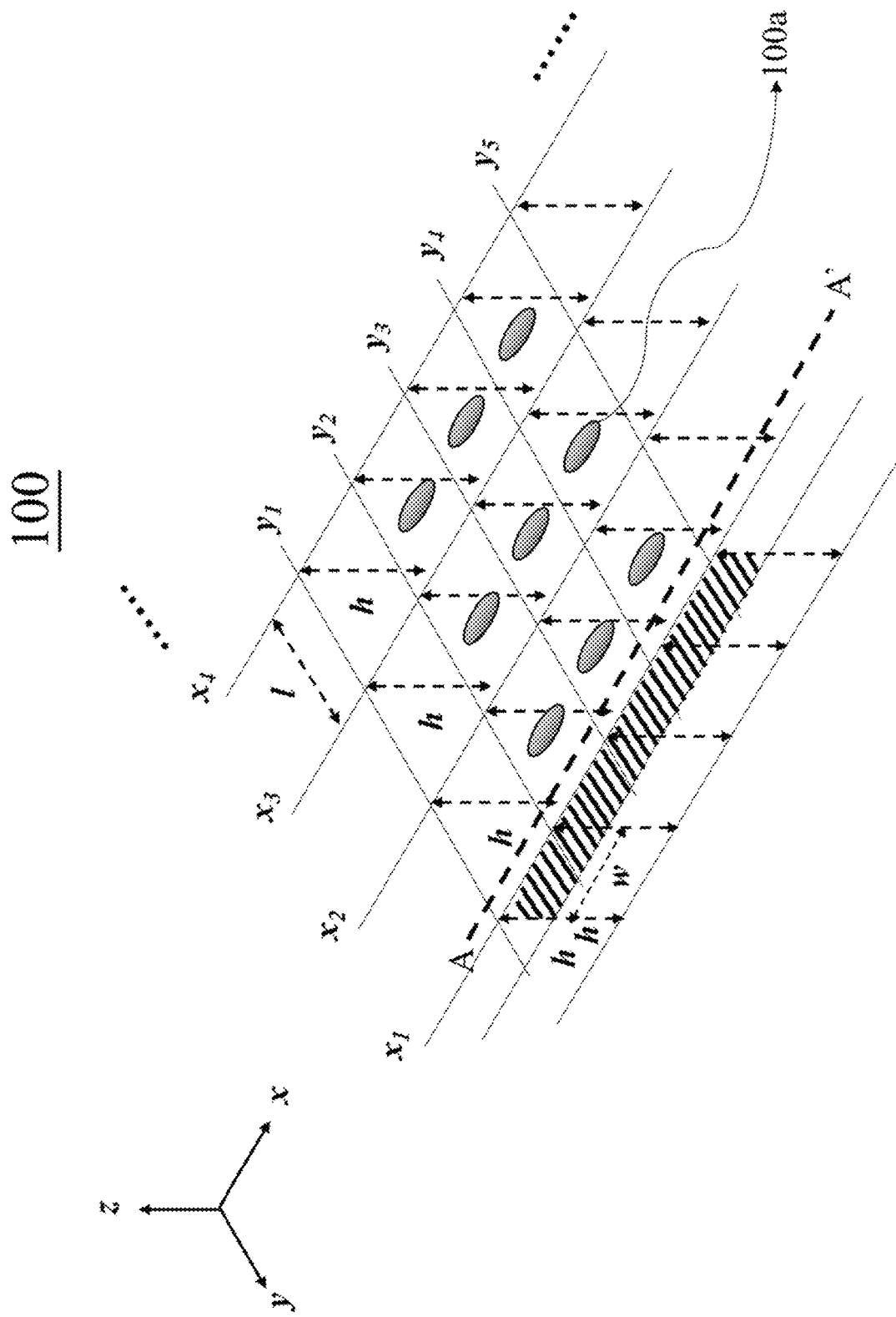
FIG. 2 illustrates the structure between the pixel units and the touch electrode gap from a perspective 3-dimensional point of view.
Figure 3A:
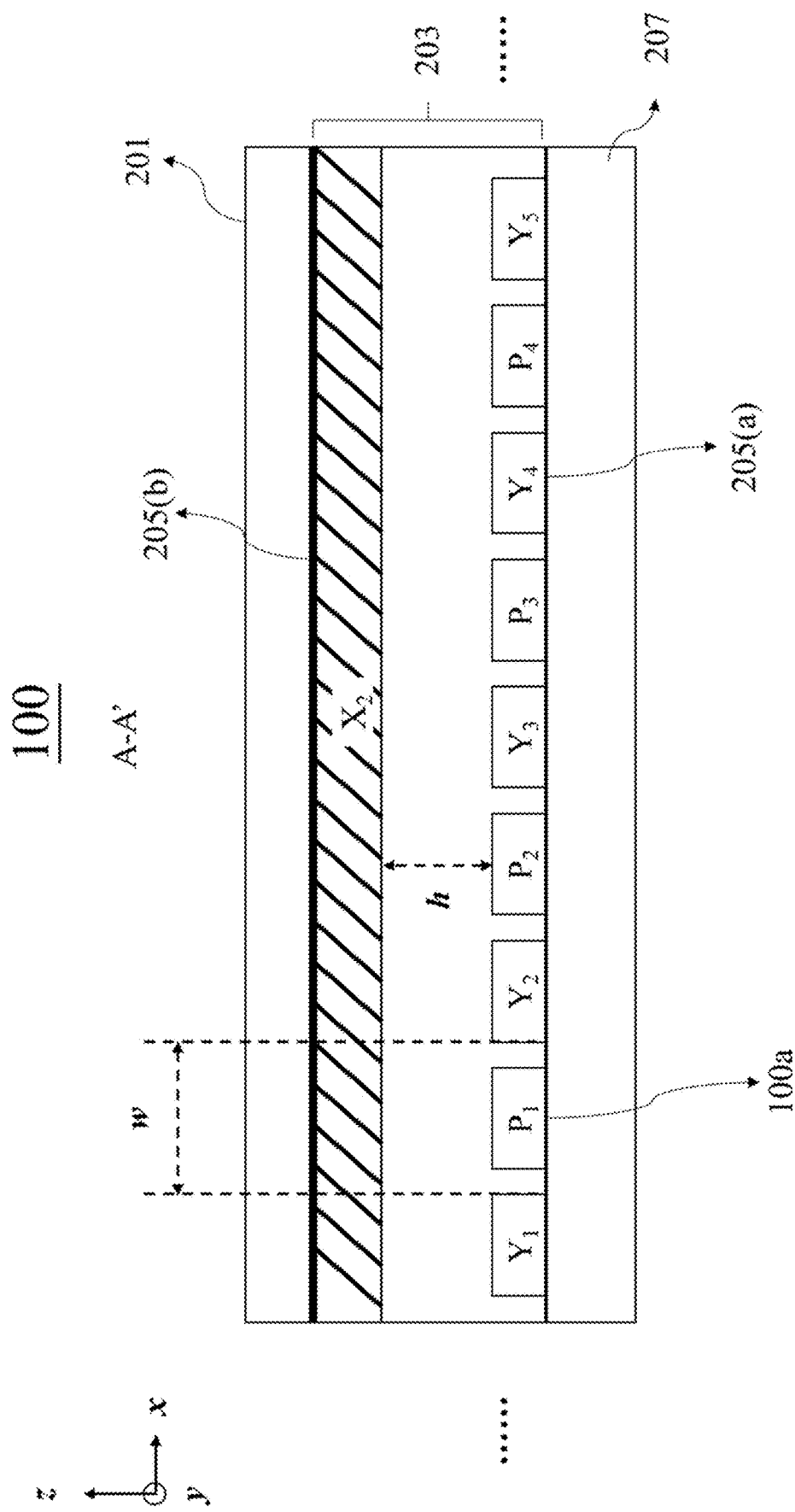
FIG. 3A illustrates a planar arrangement structure of a display with touch sensing integration according to the first embodiment of the present invention.
Figure 3B:
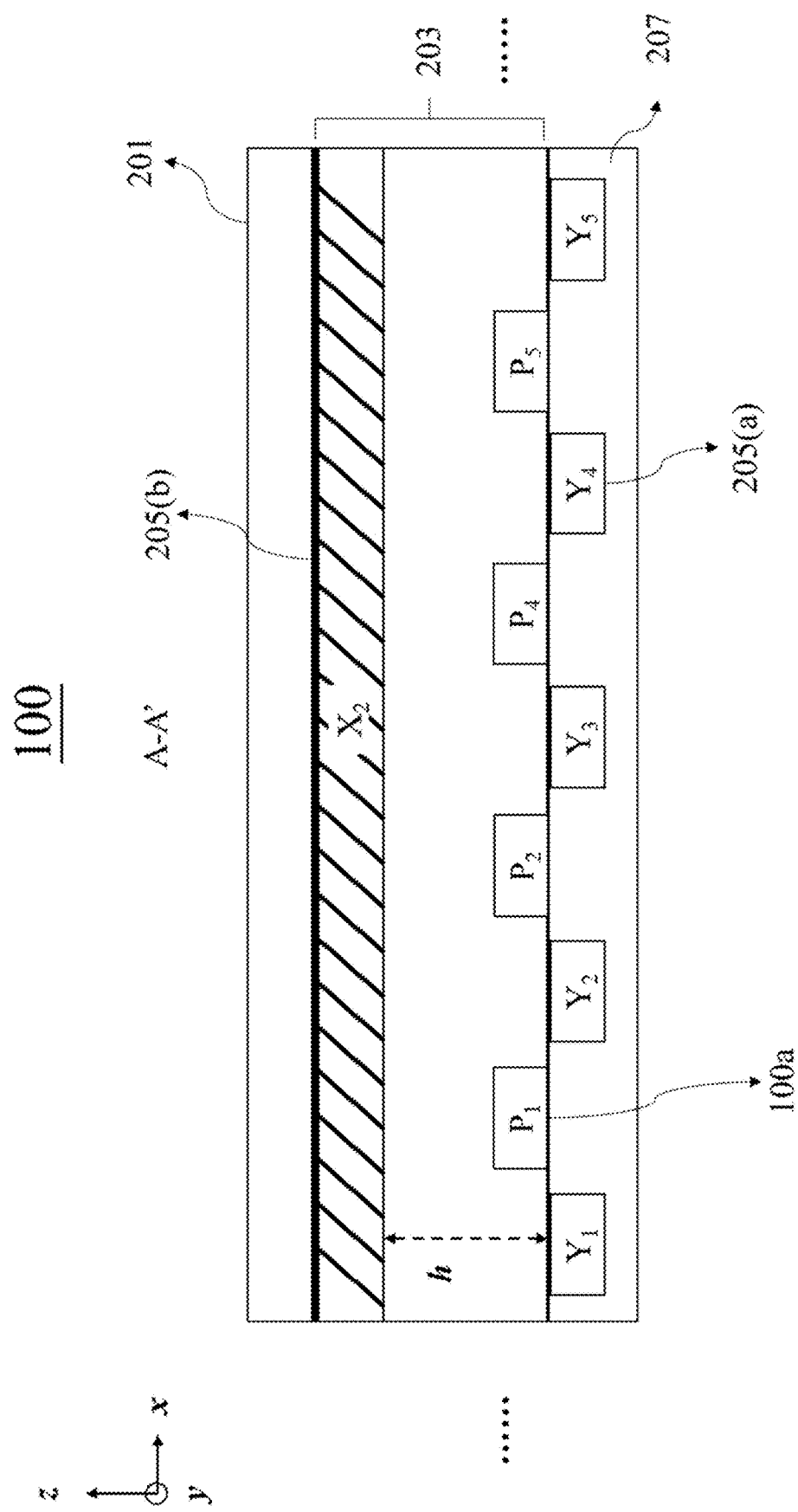
FIG. 3B illustrates a planar arrangement structure of a display with touch sensing integration in a second embodiment of the present invention.

Please refer to FIGS. 3A-3B, it shows the cross-sectional view along A-A' to depict the structure of the display 100 with touch sensing integration shown in FIG. 2, which describes its top-down stack structure in the z-direction. In one embodiment of the present invention, the display 100 with touch sensing integration includes a light-transmitting layer 201, a pixel array formed by arranging the plurality of pixels 100a, touch electrodes $X_1$-$X_M$ in the transversal direction, the touch electrodes $Y_1$-$Y_N$ in the longitudinal direction, and the substrate 207. Where the touch electrodes in the transversal direction and the longitudinal direction can be disposed inside the dielectric layer 203 as shown in FIG. 3A, and the dielectric layer can be made of light-transmitting material, such as glass or silicon dioxide. As illustrated in FIG. 3A, one set of the touch electrodes and the pixels 100a can be arranged on the upper end of the dielectric layer 203 as an upper (transversal) touch electrodes 205b, and the other set of touch electrodes are arranged on the substrate 207 to form a lower (longitudinal) touch electrodes 205a, so that the lower touch electrodes 205 and the plurality of pixels 100a can be located on the same plane. Or as shown in FIG. 3B, the lower (longitudinal) touch electrodes 205a are embedded in the interior of the substrate 207, so that the lower (longitudinal) touch electrodes 205a, the upper (transversal) touch electrodes 205b and the plurality of pixels 100a do not locate on the same plane. As illustrated in FIGS. 3A-3B, the above-mentioned transversal touch electrodes $X_1$-$X_M$ and longitudinal touch electrodes $Y_1$-$Y_N$ are respectively disposed in the longitudinal gaps and the transversal gaps, where the gap along vertical direction between the transversal touch electrodes and the longitudinal touch electrodes has a dielectric layer 203, the transversal touch electrodes $X_1$-$X_M$, the longitudinal touch electrodes $Y_1$-$Y_N$ and the dielectric layer 203 together to form corresponding capacitances. While the touch pen or the user's hand is approaching to contact the touch electrodes, the capacitances responded on the surface will be sensed, and then be processed by the driver IC to convert the responded surface area into interpretable coordinate data. Generally, when there is no conductive object in contact with the touch electrodes, there will be a initial coupling capacitance $C_{initial}$ of a fixed value between each up-down transparent touch electrode pair, and the electric field distribution between each of the touch electrode pair is fixed. While the user's finger touches touch electrodes, since the skin of the finger is conductive, the contact between the touch electrodes and the finger is equivalent to forming a new finger capacitance $C_{Finger}$ from the original coupling capacitance $C_{Initial}$. At the same time, the electric field originally fixedly distributed between each touch electrode pair will change, and therefore change the capacitance value on the correlated touch electrode pairs.

In an embodiment of the present invention, the top-down stack structure of the display 100 with touch sensing integration may be composed of a light-transmitting layer 201, a plurality of pixels 100a, and substrate 207. As explained in the above embodiment, the plurality of pixels 100a are arranged transversally and longitudinally to form a pixel array, where the plurality pixels 100a and the touch electrodes are interleaved in space. In FIGS. 3A-3B, the transparent touch electrode layers are respectively configured to the transversal (upper) touch electrode layer 205b and the longitudinal (lower) touch electrode layer 205a, respectively, i.e., the transversal (upper) touch electrode layer 205b is arranged in the x-direction, while the longitudinal (lower) touch electrode layer 205a) is arranged in the y-direction. In one aspect of the present invention, alternatively, the upper touch electrode layer can be arranged in the y-direction, while the lower touch electrode layer can be arranged in the x-direction. These arrangements are beneficial to simplify the manufacturing process of the touch electrode layer 205. In addition, since FIGS. 3A-3B are demonstrating the cross-sectional views of FIG. 2 in A-A' direction, only the transversal gaps w and the vertical gap h can be shown, but those skilled in the art should understand that when the cross-sectional view is rotated along the z-axis for 90 degrees to the side view prospective, the accommodated space for the touch electrode layer 205 along longitudinal gap/can be shown, so that the space between the gaps for accommodating the touch electrode layer 205 can be effectively utilized to achieve object of the present invention.

Figure 4:
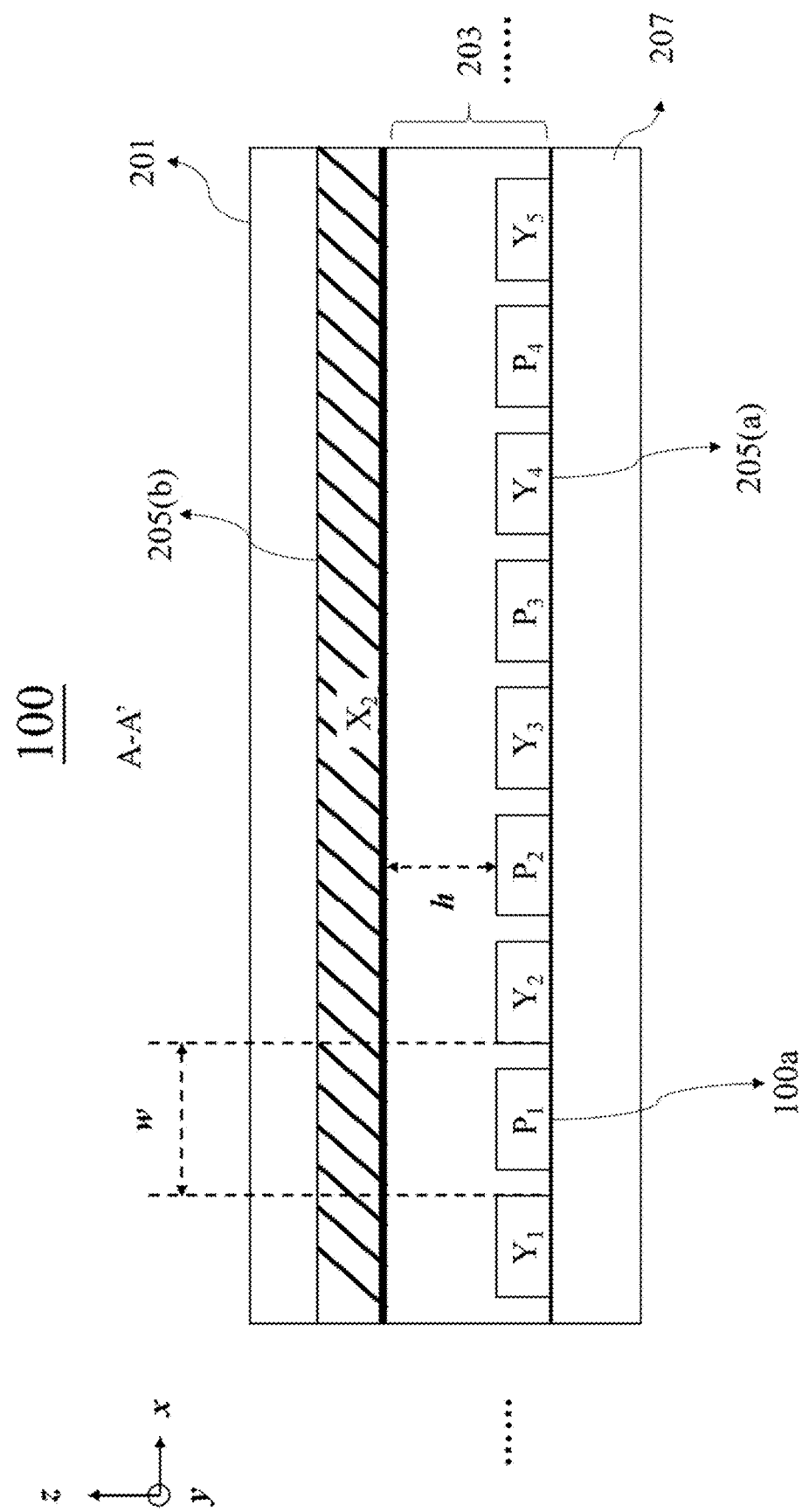
FIG. 4 illustrates a planar arrangement structure of a display with touch sensing integration in a third embodiment of the present invention.

Please refer to FIG. 4, in another embodiment of the present invention, the top-bottom stack structure of the display 100 with touch sensing integration can also be composed of a light-transmitting layer 201, a plurality of pixels 100a, touch electrodes $X_1$-$X_M$ in the transversal direction, touch electrodes $Y_1$-$Y_N$ in the longitudinal direction, and the substrate 207. In this embodiment, the touch electrodes in the longitudinal (lower) touch electrode layer 205a and in the transversal (upper) touch electrode layer 205b can also be arranged between adjacent pixels along the transversal and longitudinal direction, respectively. However, there exists differences compared to the embodiment shown in FIGS. 3A-3B, please refer to FIG. 4, the touch electrodes in one of the touch electrode layers 205 are not located inside the dielectric layer 203. Instead, as illustrated in FIG. 4, the touch electrodes in the x-direction can be disposed on top of the dielectric layer 203. From the cross-sectional view along A-A', it can be seen that the touch electrodes in the x-direction 205b are arranged on the upper end of the dielectric layer 203, and only the other touch electrodes in the y-direction 205(a) are arranged inside the dielectric layer 203. In this embodiment, the transparent touch electrodes of the upper layer may be arranged in the x-direction, and the transparent touch electrodes of the lower layer may be arranged in the y-direction, or vice versa.

Figure 5:
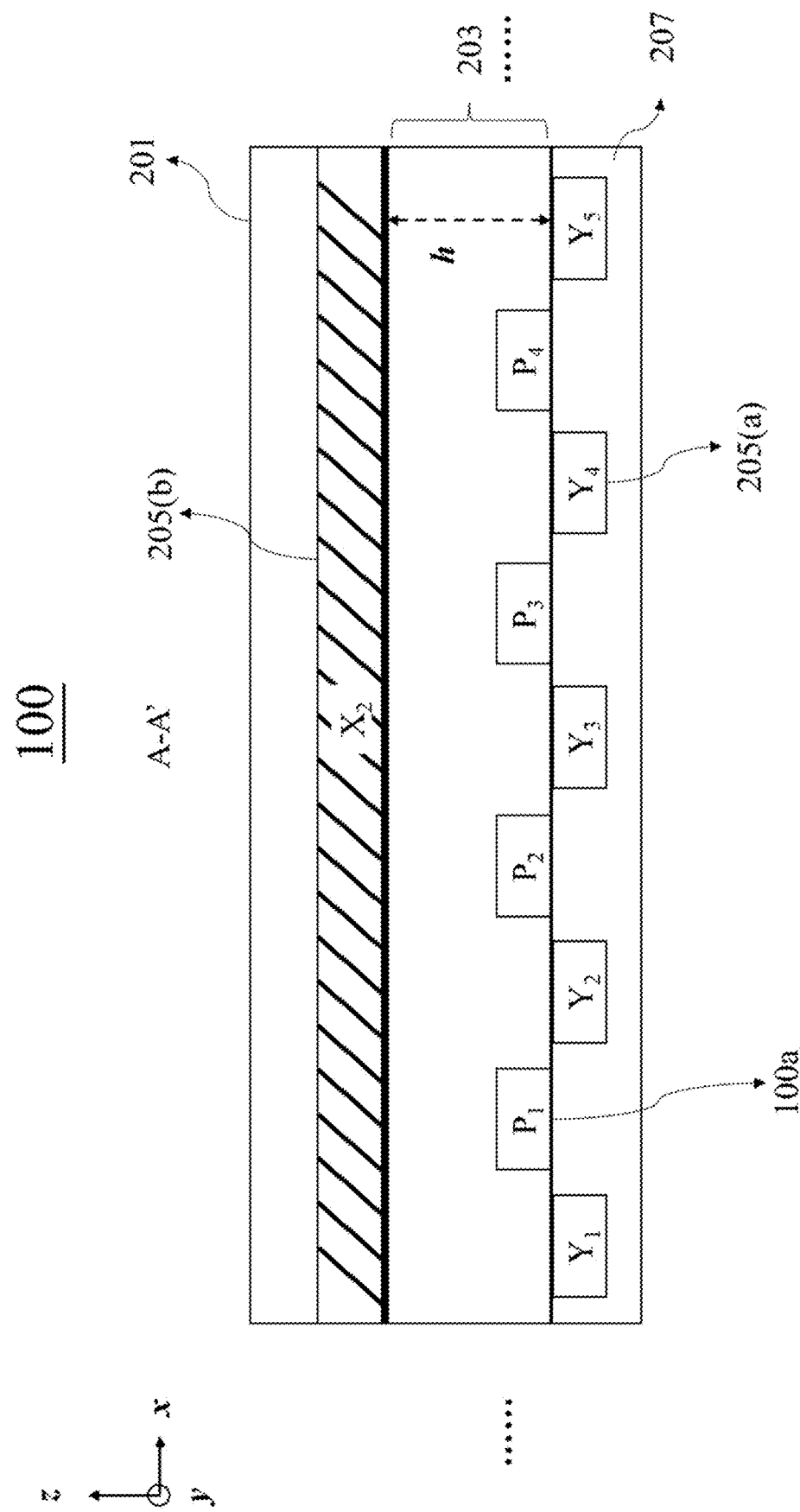
FIG. 5 illustrates a planar arrangement structure of a display with touch sensing integration in a fourth embodiment of the present invention.

Please refer to FIG. 5, in another embodiment of the present invention, the top-bottom stack structure of the display 100 with touch sensing integration display can also be composed of a light-transmitting layer 201, a plurality pixels 100a, the touch electrodes $X_1$-$X_M$ in the transversal direction, the touch electrodes $Y_1$-$Y_N$ in the longitudinal direction, and the substrate (207). In this embodiment, both layers of touch electrodes 205 are located outside the dielectric layer 203. Similarly, in this embodiment, the touch electrodes of the upper layer may be arranged in the x-direction, while the touch electrodes of the lower layer may be arranged in the y-direction, or vice versa.

In regarding to the configuration of the display 100 with touch sensing integration, in addition to a set of transversal (upper) touch electrode layer 205b and longitudinal (lower) touch electrode layer 205a, and a plurality pixels 100a are arranged in a sandwich structure between the light-transmitting layer 201 and the substrate 207; in another embodiment of the present invention, another set of transversal (upper) touch electrode layers 205b and the longitudinal (lower) touch electrode layer 205a, where one of them is arranged above the dielectric layer 203, the other is arranged below the substrate 207. In summary, the display 100 with touch sensing integration will have two sets of configurations in regarding to the arrangements of the transversal (upper) touch electrode layer 205b and the longitudinal (lower) touch electrode layer 205a. In one set of configurations, the transversal (upper) touch electrode layer 205b and the longitudinal (lower) touch electrode layer 205a can sandwich the plurality of pixels 100a in between to form a sandwich structure. In the other configuration, one of the transversal (upper) touch electrode layer 205b and the longitudinal (lower) touch electrode layer 205a is arranged above the dielectric layer 203, the other is arranged below the substrate 207. In any of the embodiments proposed in FIGS. 2-5, there is a second identical configuration of touch electrode layers but with different pitches between touch electrodes to be superimposed onto the original one to laterally offset with which, therefore to form a two-set touch electrode layers. This idea is proposed to further make efficient use of the space between adjacent pixels of the pixel array. In this alternative, to prevent the control signals of individual set of touch electrodes from interfering with each other, the scanning frequencies of the corresponding control signals can be set to be different.

Following the above-mentioned embodiment, the display 100 with touch sensing integration has two-set of touch electrode layers, i.e., transversal (upper) touch electrode layers 205b and longitudinal (lower) touch electrode layers 205a can have identical configuration but having different pitches between electrodes superimposed on each other, to prevent their corresponding control signals from interfering with each other while operating the display 100, different scanning frequencies can be used for the application of two-set touch sensing. Therefore, multiple-fingerprint sensing such as dual fingerprint sensing can be realized.

According to the content of the present invention, the display 100 can be chosen from a sub-millimeter light-emitting diode (Mini LED), a micrometer light-emitting diode (Micro LED), or organic light-emitting diode (OLED) with active luminous functionality according to the needs of the application. Among them, the diode size boundary between Mini LED and Micro LED is about 100 μm. The diode size above 100 μm is defined as Mini LED, and the diode size smaller than 100 μm is defined as Micro LED. However, those skilled in the art should understand that the above definitions can also be updated within a reasonable range according to the evolution of technology in the market, and the above dimensions are only used to illustrate rather than limit the scope of the present invention.

According to the content of the present invention, Mini LED, Micro LED, or OLED can provide the innate ability to emit light. Different diode materials can be used to emit photons of different wavelengths, for example, three colors of RGB, so that they can be combined into self-luminous pixels 100a to display a desired picture. These self-luminous pixels 100a are directly used as the light source of the display 100 with touch sensing integration. The traditional color filter layer and LCD structure can be omitted, therefore the display 100 with touch sensing integration can be widely used for smart wearable devices and other small-sized displays, it has the advantages in viewing angle, contrast, color gamut and brightness.

While various embodiments of the present invention have been described above, it should be understood that they have been presented by a way of example and not limitation. Numerous modifications and variations within the scope of the invention are possible. The present invention should only be defined in accordance with the following claims and their equivalents.

What is claimed is:

1. A display with touch sensing integration, said display comprising:
   a plurality of pixels arranged to form a light-emitting array;
   a plurality of transversal gaps form between adjacent pixels in transversal directions of said light-emitting array;
   a plurality of longitudinal gaps form between adjacent pixels in longitudinal directions of said light-emitting array;
   transversal touch electrodes arranged between said plurality of longitudinal gaps; and
   longitudinal touch electrodes arranged between said plurality of transversal gaps;
   wherein said transversal touch electrodes, said longitudinal touch electrodes and said plurality of pixels are interleaved in space;

wherein said longitudinal touch electrodes, said transversal touch electrodes and said plurality of pixels are disposed between a dielectric layer and a substrate in a sandwich structure.

2. The display with touch sensing integration of claim 1, wherein said light-emitting array is selected from sub-millimeter light-emitting diode (Mini LED), millimeter light-emitting diode (Micro LED), or organic light-emitting diode (OLED).

3. The display with touch sensing integration of claim 1, wherein one of said transversal touch electrodes or said longitudinal touch electrodes are arranged on top of said plurality of transversal gaps and said plurality of longitudinal gaps to form an upper touch electrode layer, and the other are arranged below said plurality of transversal gaps and said plurality of longitudinal gaps to form a lower touch electrode layer.

4. The display with touch sensing integration of claim 3, wherein there is a second dielectric layer between said transversal touch electrodes and said longitudinal touch electrodes.

5. The display with touch sensing integration of claim 4, wherein said transversal touch electrodes or said longitudinal touch electrodes is located inside said second dielectric layer.

6. The display with touch sensing integration of claim 4, wherein said transversal touch electrodes and said longitudinal touch electrodes are located outside said second dielectric layer.

7. The display with touch sensing integration of claim 4, wherein said transversal touch electrodes and said longitudinal touch electrodes are located inside said second dielectric layer.

8. The display with touch sensing integration of claim 1, wherein material of said transversal touch electrodes or said longitudinal touch electrodes is selected from Indium Tin Oxide (ITO), nanosilver, carbon nanotube (CNT), or Zinc Oxide (ZnO).

9. The display with touch sensing integration of claim 8, wherein said light-emitting array is selected from sub-millimeter light-emitting diode (Mini LED), millimeter light-emitting diode (Micro LED), or organic light-emitting diode (OLED).

10. The display with touch sensing integration of claim 1, wherein one of said longitudinal touch electrodes and said transversal touch electrodes are disposed above a second dielectric layer, and the other is disposed below a substrate.

11. The display with touch sensing integration of claim 9, wherein scanning frequency utilize to operate said longitudinal touch electrodes and said transversal touch electrodes is different from that of operating said plurality of pixels.

12. The display with touch sensing integration of claim 4, wherein said upper touch electrode layer and said lower touch electrode layer are superimposed with another identical configuration of touch electrode layers but with different pitches between touch electrodes to laterally offset with which to form a two-set touch electrode layers for performing a two-set touch sensing.

13. The display with touch sensing integration of claim 12, wherein each configuration of said two-set touch electrode layers can be operated with different scanning frequencies to perform said two-set touch sensing.

* * * * *